United States Patent
Rakshani

(10) Patent No.: US 7,528,484 B2
(45) Date of Patent: May 5, 2009

(54) MULTI-CONCENTRIC PAD ARRANGEMENTS FOR INTEGRATED CIRCUIT PADS

(75) Inventor: Vafa James Rakshani, Newport Coast, CA (US)

(73) Assignee: Broadcom Corporation, Irvine, CA (US)

( * ) Notice: Subject to any disclaimer, the term of this patent is extended or adjusted under 35 U.S.C. 154(b) by 20 days.

(21) Appl. No.: 11/025,118

(22) Filed: Dec. 30, 2004

(65) Prior Publication Data

US 2005/0110136 A1 May 26, 2005

Related U.S. Application Data

(63) Continuation of application No. 10/355,112, filed on Jan. 31, 2003, now Pat. No. 6,858,945.

(60) Provisional application No. 60/404,774, filed on Aug. 21, 2002.

(51) Int. Cl.
*H01L 23/34* (2006.01)
(52) U.S. Cl. ..................................................... 257/724
(58) Field of Classification Search ......... 257/724–738, 257/690–691, E31.111, 203–204, E23.142
See application file for complete search history.

(56) References Cited

U.S. PATENT DOCUMENTS

| | | | | |
|---|---|---|---|---|
| 5,155,065 A | * | 10/1992 | Schweiss | 438/599 |
| 5,455,460 A | * | 10/1995 | Hongo et al. | 257/734 |
| 5,510,654 A | * | 4/1996 | Nishino et al. | 257/773 |
| 5,521,530 A | * | 5/1996 | Yao et al. | 326/80 |
| 5,543,651 A | | 8/1996 | Sato | |
| 5,581,109 A | | 12/1996 | Hayashi et al. | |
| 5,646,548 A | * | 7/1997 | Yao et al. | 326/80 |

(Continued)

FOREIGN PATENT DOCUMENTS

EP 0 887 800 A2 12/1998

(Continued)

OTHER PUBLICATIONS

Lammers, "LSI Logic Extends Reach of Wire Bond Packaging," EETIMES, Oct. 22, 2002, pp. 1-3.

(Continued)

*Primary Examiner*—Nathan W Ha
(74) *Attorney, Agent, or Firm*—Sterne, Kessler, Goldstein & Fox PLLC

(57) ABSTRACT

Multi-concentric pad (MCP) arrangements provide for increased pad densities on integrated circuits. The multi-concentric pad (MCP) configuration includes a first set of input output (IO) pads and a second set of IO pads, both disposed on an integrated circuit die. Each IO pad in said first set and said second set of IO pads includes a bond pad for receiving a bond wire connection, and an IO circuit coupled to the bond pad. The IO circuits provide an interface between a signal received at the corresponding bond pad and a core circuit disposed on said IC die. The first set of IO pads are arranged closer to the perimeter of the IC die than the second set of IO pads. Furthermore, the second set of IO pads are arranged so that each IO circuit in the second set of IO pads is closer to the center of the IC die than a corresponding IO circuit in the first set of IO pads.

16 Claims, 11 Drawing Sheets

U.S. PATENT DOCUMENTS

| | | | |
|---|---|---|---|
| 5,796,171 A * | 8/1998 | Koc et al. | 257/786 |
| 5,814,892 A * | 9/1998 | Steidl et al. | 257/784 |
| 5,818,114 A * | 10/1998 | Pendse et al. | 257/786 |
| 5,861,662 A | 1/1999 | Candelore | |
| 5,986,294 A * | 11/1999 | Miki et al. | 257/203 |
| 6,008,532 A * | 12/1999 | Carichner | 257/691 |
| 6,043,539 A | 3/2000 | Sugasawara | |
| 6,091,089 A | 7/2000 | Hiraga | |
| 6,191,491 B1 | 2/2001 | Hiraga | |
| 6,222,213 B1 | 4/2001 | Fujiwara | |
| 6,489,688 B1 | 12/2002 | Baumann et al. | |
| 6,725,439 B1 * | 4/2004 | Homsinger et al. | 716/12 |
| 6,727,596 B2 * | 4/2004 | Takabayashi et al. | 257/786 |
| 6,762,507 B2 * | 7/2004 | Cheng et al. | 257/786 |
| 6,784,558 B2 * | 8/2004 | Jassowski | 257/786 |
| 6,858,945 B2 | 2/2005 | Rakshani | |
| 6,919,632 B2 | 7/2005 | Sei | |
| 6,940,093 B2 * | 9/2005 | Eldridge et al. | 257/48 |
| 2002/0089070 A1 | 7/2002 | Manning et al. | |
| 2002/0149263 A1 * | 10/2002 | Blanco et al. | 307/64 |
| 2006/0011997 A1 * | 1/2006 | Kalnitsky et al. | 257/414 |

FOREIGN PATENT DOCUMENTS

| | | |
|---|---|---|
| EP | 1 205 974 A2 | 5/2002 |
| JP | 3-138972 A | 6/1991 |
| JP | 2003-100891 A | 4/2003 |

OTHER PUBLICATIONS

Search Report for European Application No. EP 03 01 8920 completed on May 24, 2004, 3 pgs.

* cited by examiner

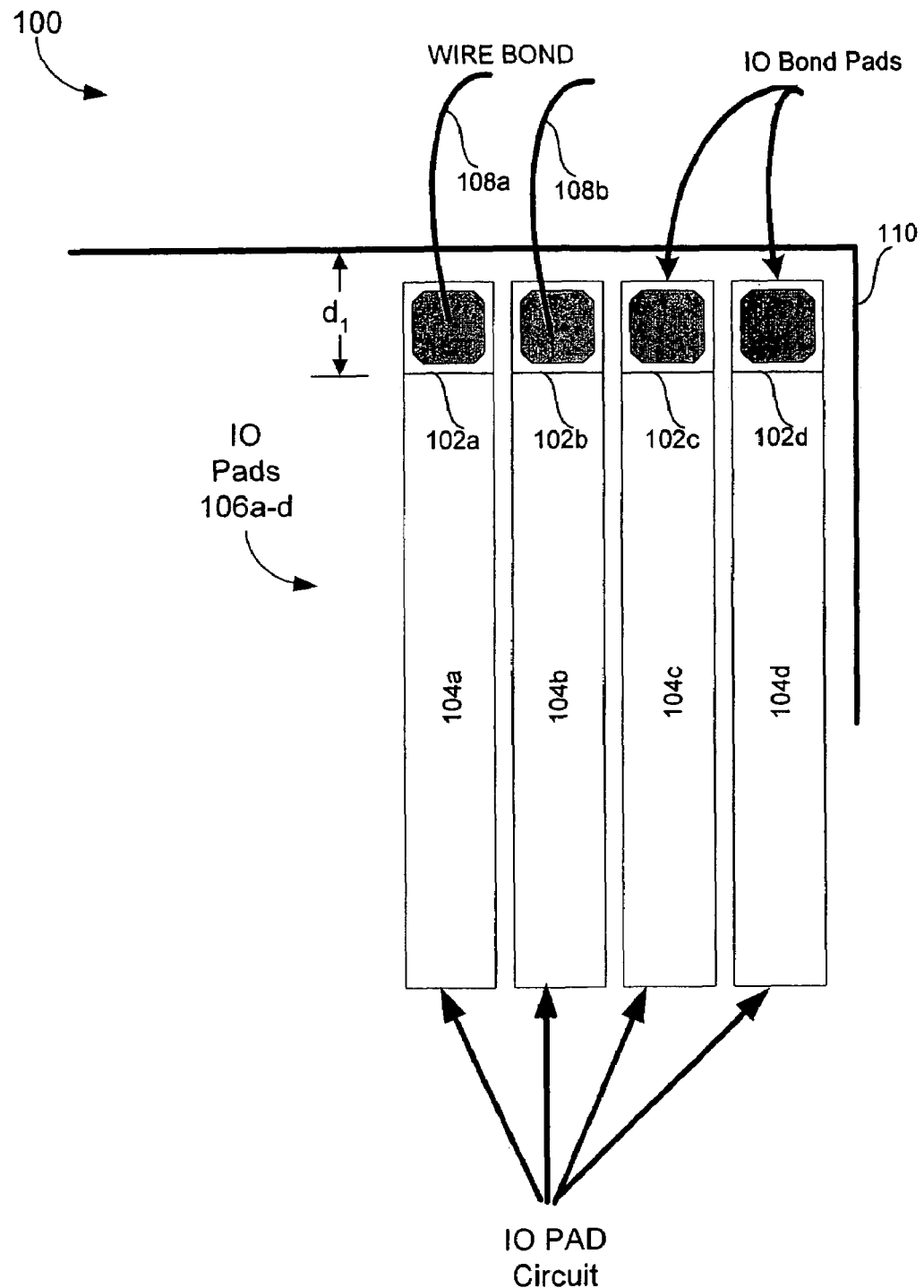
FIG. 1
(Conventional)

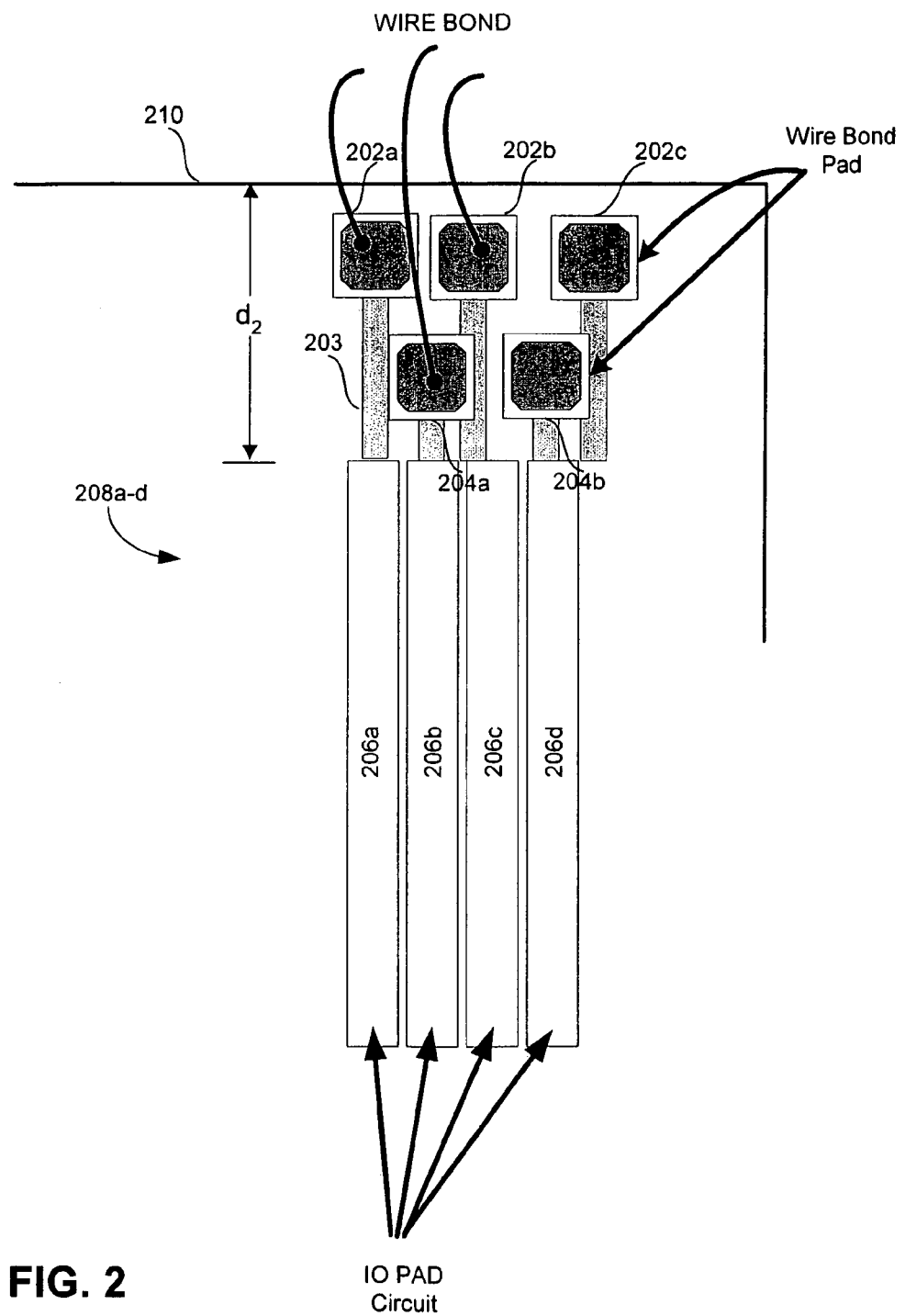
**FIG. 2
(Conventional)**

MULTI-CONCENTRIC PAD ARRANGEMENTS FOR INTEGRATED CIRCUIT PADS

CROSS-REFERENCE TO RELATED APPLICATIONS

This application is a continuation of U.S. patent application Ser. No. 10/355,112, filed on Jan. 31, 2003 which claims benefit of U.S. Provisional Application No. 60/404,774, filed Aug. 21, 2002 now abandoned both of which are incorporated by reference herein in its entirety.

BACKGROUND OF THE INVENTION

1. Field of the Invention

This invention relates generally to packages for integrated circuit devices, and placing input and output pads on an integrated circuit device in order to optimize the die size of the integrated circuit device.

2. Related Art

There are various methods for the wire bonding of packages which house integrated circuit (IC) dies. In these methods, the physical limitations in wire bonding have made it difficult to reduce the I/O pad pitch of the IC die below approximately 50-100 microns. In many high density I/O IC designs, this leads to die sizes that are considerably larger than the active core size. An integrated circuit die where the die size is larger than the active core size is referred to as "pad-limited." Because a pad-limited die contains significant portions of the unused space, the die is larger and fewer dies will be printed per wafer. This means that the die cost is higher.

There are numerous obstacles that limit the number of pads on a die. Various techniques for improving the pad count on a die have been developed, such as staggering the pads. The physical and geometrical structure of the pad itself is a major limiting factor.

These approaches are directed towards the bonding pad configuration of the die. A portion of the conventional single row, in-line bonding pad configuration used for packages is shown in FIG. 1. FIG. 1 illustrates a portion of an IC die 100 having input and output pads 106a-d that provide connections between the IC die 100 and external circuit(s). Each input output pad 106 includes a bond pad 102 that is connected to an IO pad circuit 104. Bond wires 108 are bonded to the bond pads 102 in order to communicate input and output signals to and from the IC die 100. The IO pad circuits 104 provide any necessary interface circuitry between the IC die 100 and the external circuits connected to the bond pads 108. More specifically, the IO pad circuits 104 provide an interface to the core circuitry of the IC die 100. The core circuitry of the IC die 100 is the primary functioning circuitry of the IC die 100, and varies according the particular IC as will be understood by those skilled in the arts. As such, the IO pad circuits 104 also vary according to the IC die 100, as will be understood by those skilled in the arts. Regarding FIG. 1, it is noticed the IO pad circuits 104 are adjacent to one another and are the same distance $d_1$ from the perimeter 110 of the IC die 100.

FIG. 2 illustrates an IC die 200 with staggered IO pads 208a-d having outer bond pads 202a-c, inner bond pads 204a-b, and IO pad circuits 206a-d. Compared to the conventional single row in-line bonding pad configuration of FIG. 1, the two-row staggered configuration of FIG. 2 provides smaller die size in a pad limited design, or has at least one additional bond pad in the same space. The staggered configuration of FIG. 2 can be implemented in single or multi-tiered package structures. In these package structures, the inner row of bonding pads 204 are bonded to a different surface of the package than the outer row of bonding pads 202, where there is a height differential between the two surfaces. IO pad circuits 206a-d are connected to the respective staggered bond pads 202, 204 using metal traces, for example, metal trace 203. It is again noted that even thou the bond pads 202, 204 are staggered, the IO pad circuits 206 are still adjacent to one another and are equally distant $d_2$ from the perimeter 210 of the IC die 200. The fact that the IO pad circuits 206 are adjacent to one another limits the overall pad density.

There is a need for an approach that increases bonding pad density, which is reliable and cost effective and reduces die size of pad limited designs compared to conventional configurations.

SUMMARY OF THE INVENTION

The present invention is a multi-concentric pad (MCP) configuration for an integrated circuit die that provide for increased pad density. The multi-concentric pad (MCP) configuration includes a first set of input output (IO) pads and a second set of IO pads, both disposed on an integrated circuit die. Each IO pad in said first set and said second set of IO pads includes a bond pad for receiving a bond wire connection, and an IO circuit coupled to the bond pad. The IO circuits provide an interface between a signal received at the corresponding bond pad and a core circuit disposed on said IC die. The first set of IO pads are arranged closer to the perimeter of the IC die than the second set of IO pads. Furthermore, the second set of IO pads are arranged so that each IO circuit in the second set of IO pads is closer to the center of the IC die than a corresponding IO circuit in the first set of IO pads. Stated another way, the first and second sets of IO pads are stacked, so that even the IO circuits are first set of IO pads are stacked upon the IO circuits on the IO circuits of the second set of IO pads.

By stacking the IO pads, a higher pad density is achieved with a linear cost increase per pad count. Thus, the present invention enables higher pad density using conventional packaging. In some embodiments, flip-chip redistribution layers are used, but this is not required of other embodiments of the present invention.

In one embodiment, a mesh interconnect electrically connects the first and second IO pads to provide electrostatic discharge protection.

In another embodiment, at least one of the IO pads in the first set is electrically coupled to at least one IO pad in the second set using a bond wire.

In another embodiment, adjacent IO pads in one of the first set or the second set are configured to allow at least one wire to pass between the adjacent IO pads to the other set of pads. The wire that passes between the adjacent pads can be a power supply wire or a ground wire.

In another embodiment of the present invention, the multi-concentric pad configuration further includes one or more additional sets of IO pads having respective IO circuits that are closer to the center of said IC die than said corresponding IO circuits of said second set of IO pads.

In one embodiment, the pads in one of the first set or the second set are configured in an in-line arrangement.

In another embodiment, the pads in one of the first set or the second set are configured in a staggered arrangement.

In yet another embodiment, the integrated circuit die is configured with a flip-chip redistribution layer.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

In the drawings:

FIG. 1 shows a top view of a portion of a conventional single row in-line pad arrangement.

FIG. 2 shows a top view of a portion of a conventional staggered pad arrangement.

Figure 3A:
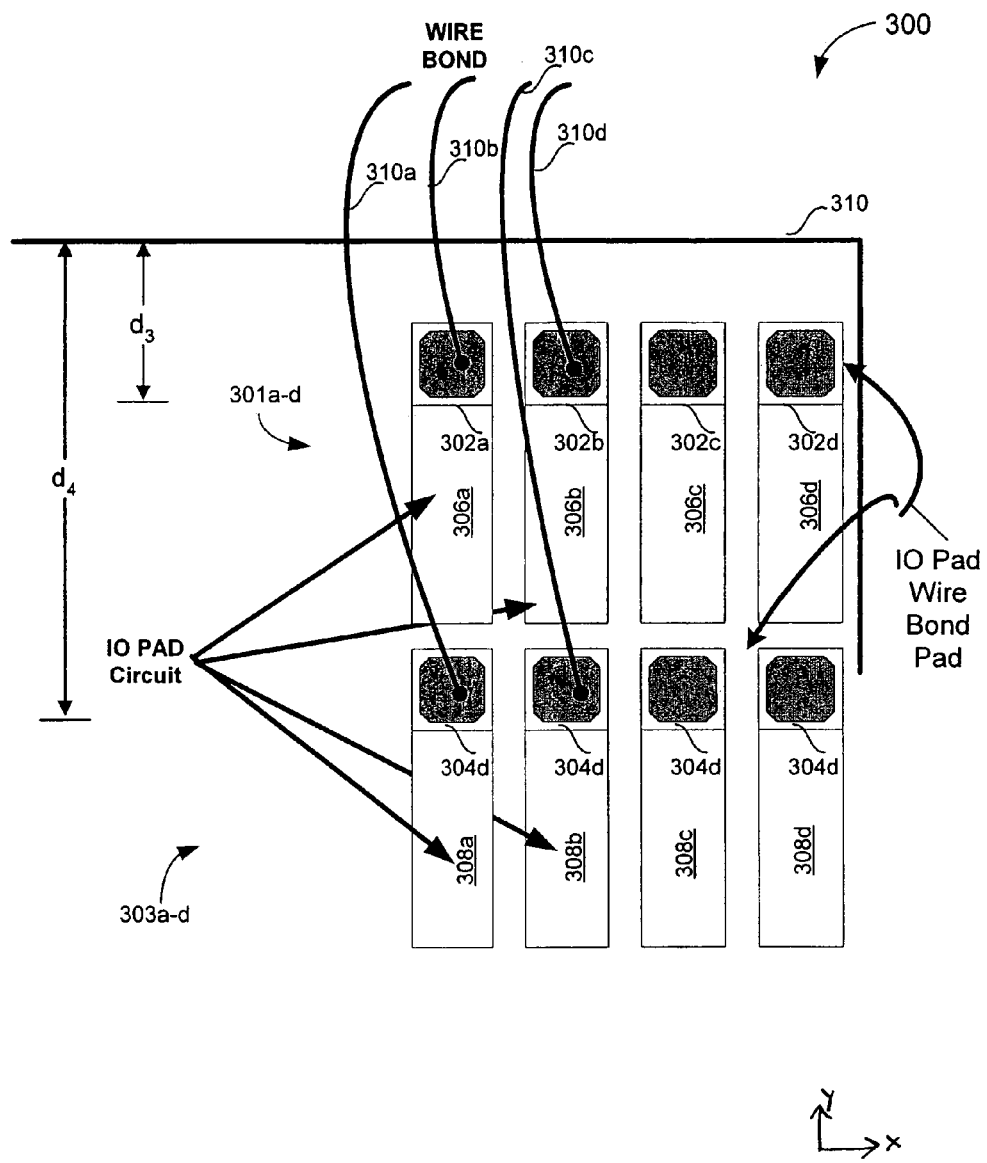
FIG. 3A shows a MCP diagram based on an in-line arrangement according to an embodiment of the present invention.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

As introduced above, the present invention involves an approach to layering sets of MCP to increase pad density. FIGS. 3A-B, 4, and 5, described below, illustrate this approach with the use of pad sets and a mesh interconnect.

FIG. 3A shows an IC die 300 having a multi-concentric pad (MCP) arrangement based on an in-line pad arrangement according to an embodiment of the present invention. IC die 300 includes IO pad set (or row) 301 and IO pad set 303.

IO pad set 301 includes IO pads 301a, 301b, 301c, and 301d. Each IO pad 301 includes a bond pad 302 that is connected to an IO circuit 306. Bond wires 310 are bonded to the bond pads 302 in order to communicate input and output signals to and from the IC die 300. The IO pad circuits 306 provide any necessary interface circuitry between the IC die 300 and the external circuits connected to the bond pads 302. More specifically, the IO pad circuits 306 provide an interface to the core circuitry of the IC die 300.

Similarly, IO pad set 303 includes IO pads 303a, 303b, 303c, and 301d. Each IO pad 303 includes a bond pad 304 that is connected to an IO circuit 308. Bond wires 310 are also bonded to the bond pads 304 in order to communicate input and output signals to and from the IC die 300. The IO pad circuits 308 provide any necessary interface circuitry between the IC die 300 and the external circuits connected to the bond pads 304. More specifically, the IO pad circuits 308 provide an interface to the core circuitry of the IC die 300.

It is noted the IO pad set 301 is closer to the perimeter 310 of the IC die 300 than the IO pad set 303, and the IO pad set 303 is closer to the center of the IC die 300. It is also noted that the IO circuits 306 and the IO circuits 308 are not adjacent to one another. Instead, the IO circuits 306 are arranged a distance $d_3$ from the perimeter 310 and the IO circuits 308 are arranged a distance $d_4$ from the perimeter 310, where $d_4$ is greater than $d_3$. Stated another way, the IO circuits 308 are closer to the center of the IC die 300 than the IO circuits 301. The multi-concentric pad configuration (in FIG. 3A) allows for increased pad density relative to the adjacent IO circuits 104 and 206 that are shown in FIGS. 1 and 2. This occurs because the width of the IO circuits limit how many can be stacked side-by-side in FIGS. 1 and 2. Whereas, this limitation is relieved in FIG. 3 by stacking the IO circuits 306 and 308 on top of one another.

In one embodiment, the IO pad set 301 and the IO pad set 303 are operationally independent. For example, the IO pad set 301 and the IO pad set 303 can be configured to receive or transmit entirely distinct signals. The sets can operate as such and essentially double the pad count of the IC without impacting the die area. Conventional pad structures can grossly affect the die area.

In FIG. 3A, the IO pads 301 are aligned with the IO pads 303. This alignment is not required by the invention. The IO pads 301 can be shifted in the x-direction with respect to the IO pads 303.

Figure 3B:
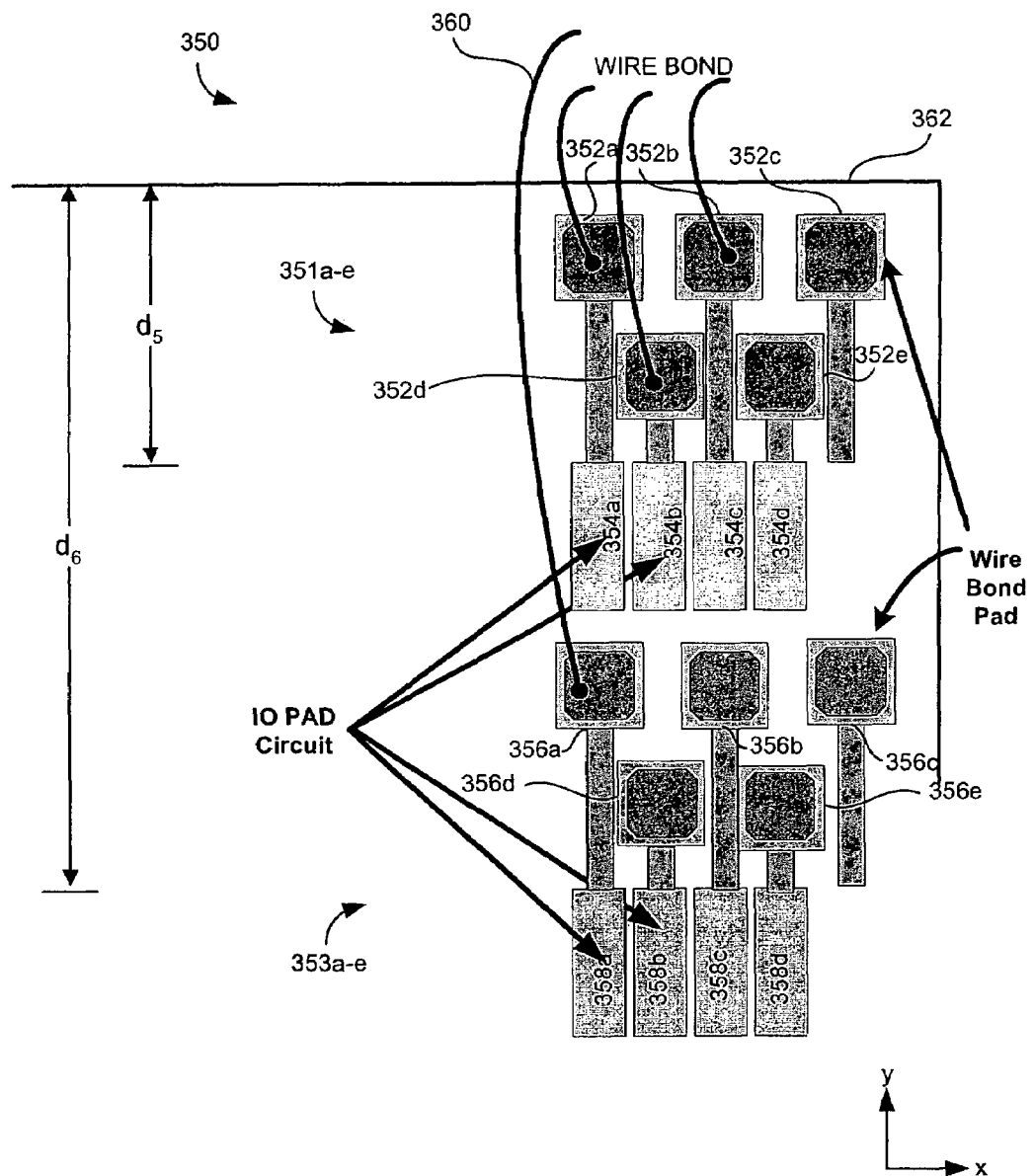
FIG. 3B shows a MCP diagram based on a staggered arrangement according to an embodiment of the present invention.

FIG. 3B shows an IC die 350 having a multi-concentric pad (MCP) arrangement based on a staggered arrangement according to an embodiment of the present invention. In FIG. 3B, IO pads 351a-e form a first staggered set, and IO pads 353a-e form another staggered set. These sets can be electrically coupled and operate similar to sets 301 and 303, described above.

IO pad set 351a-e include IO pads 351a, 351b, 351c, 351d, and 351e. Each IO pad 351 includes a bond pad 352 that is connected to an IO circuit 354. The bond pads 352 are staggered so that the bond pads 352a, 352b, and 352c form an outer row (or set) and the bond pads 352d and 352e form an inner bond pad row. Bond wires 360 are bonded to the bond pads 352 in order to communicate input and output signals to and from the IC die 350. The IO circuits 354 provide any necessary interface circuitry between the IC die 350 and the external circuits connected to the bond pads 352. More specifically, the IO circuits 354 provide an interface to the core circuitry of the IC die 350.

Similarly, IO pad set 353a-e include IO pads 353a, 353b, 353c, 353d, and 353e. Each IO pad 353 includes a bond pad 356 that is connected to an IO circuit 358. The bond pads 356 are staggered so that the bond pads 356a, 356b, and 356c form an outer row (or set) and the bond pads 356d and 356e form an inner bond pad row. Bond wires 360 are bonded to the bond pads 356 in order to communicate input and output signals to and from the IC die 350. The IO circuits 358 provide any necessary interface circuitry between the IC die 350 and the external circuits connected to the bond pads 352. More specifically, the IO circuits 358 provide an interface to the core circuitry of the IC die 350.

It is noted the IO pad set 351 is closer to the perimeter 362 of the IC die 350 than the IO pad set 353, and the IO pad set 353 is closer to the center of the IC die 350. It is also noted that the IO circuits 354 and the IO circuits 358 are not adjacent to one another. Instead, the IO circuits 354 are arranged a distance $d_5$ from the perimeter 362 and the IO circuits 358 are arranged a distance $d_6$ from the perimeter 362, where $d_6$ is greater than $d_5$ Stated another way, the IO circuits 358 are closer to the center of the IC die 350 than the IO circuits 354. The multi-concentric pad configuration (in FIG. 3B) allows for increased pad density relative to the adjacent IO circuits 104 and 206 that are shown in FIGS. 1 and 2, and even that of FIG. 3A. This occurs because the width of the IO circuits limit how many can be stacked side-by-side in FIGS. 1 and 2. Whereas, this limitation is relieved in FIG. 3B by stacking the IO circuits 354 and 358 on top of one another, and by using the staggered arrangement to increase pad density even more.

As in FIG. 3A, the IO pads 351 in FIG. 3B can be shifted in the x-direction relative to the IO pads 353.

Figure 4:
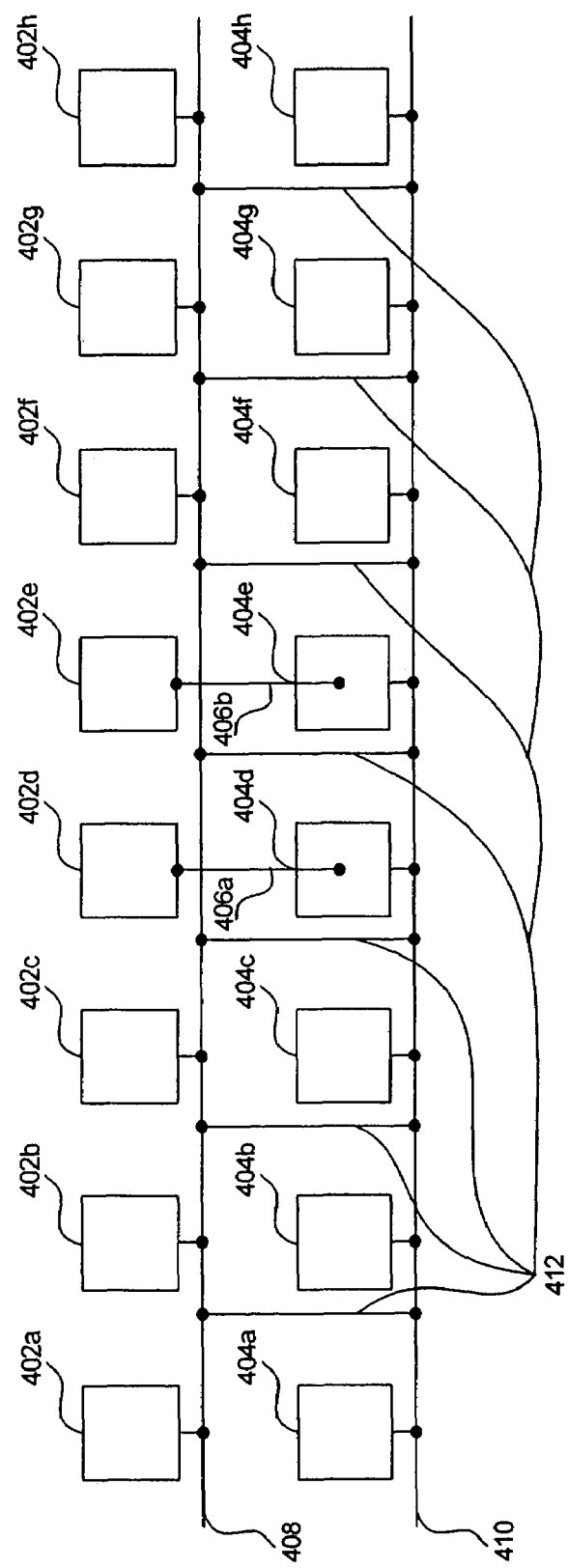
FIG. 4 shows a MCP diagram with two pad sets and a mesh interconnect according to an embodiment of the present invention.

FIG. 4 shows a MCP diagram with two IO pad sets 402 and 404, and a mesh interconnect 412 according to an embodiment of the present invention. In FIG. 4, the mesh interconnect 412 forms an electrical connection between pad set 402 and pad set 404. Coupling 406a provides direct connectivity between IO pads 402d and 404d, and coupling 406b provides direct connectivity pads between pads 402e and 404e. The couplings 406a and 406b can pass signals and essentially binds the pad sets (or doubles-up) and is an optional feature of the present invention. Electrical signal lines 408 and 410 are capable of providing power, ground, and other signals to/from the pads via mesh 412. In one embodiment, the mesh interconnect 412 provide electrostatic discharge protection (ESD). Elements 408, 410, and 412 are, in this embodiment, a node that can be used to route a power, ground, or another signal from one set to another set. In the embodiment shown in FIG. 4, an in-line configuration is employed. In alternative embodiments, a staggered configuration is possible.

In an embodiment of the present invention, a multi-concentric pad configuration on an integrated circuit die includes a first set of pads, such as pad sets 402 on an integrated circuit die, a mesh interconnect, such as 406a-b and 412, that is electrically coupled to the first set of pads, and a second set of pads, such as set 404, on the integrated circuit die electrically coupled to the mesh interconnect.

According to one embodiment of the present invention, the mesh interconnect can provide electrostatic discharge protection between the first set of pads and the second set of pads. In another embodiment, the pads are electrically coupled to a package via one or more bond wires.

Figure 5:
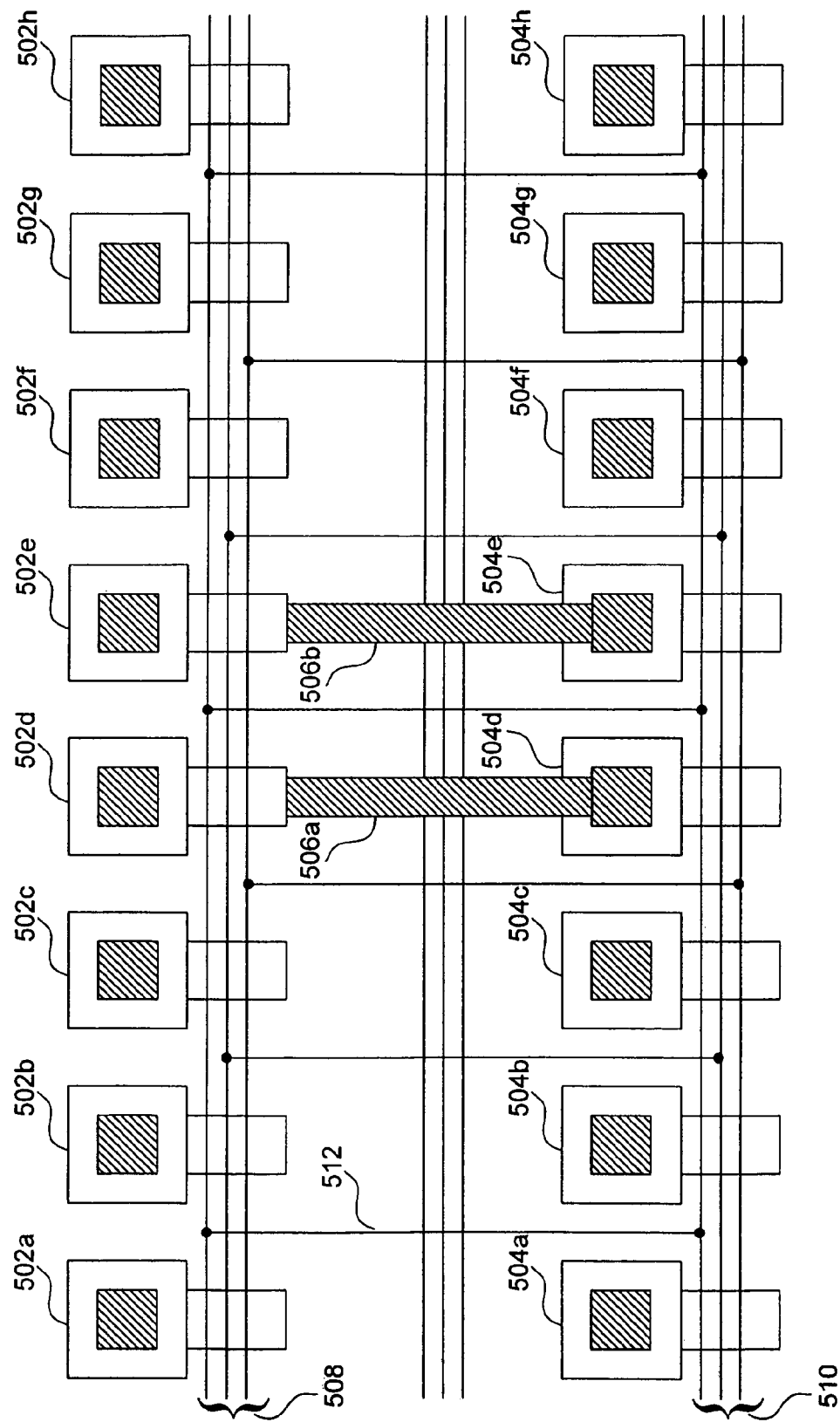
FIG. 5 shows a more detailed diagram of MCP with two pad sets and a mesh interconnect according to an embodiment of the present invention.

FIG. 5 shows a more detailed diagram of MCP with two pad sets and a mesh interconnect according to an embodiment of the present invention. In FIG. 5, signal lines 508 and 510 show that more than one line can be available for each. Couplings 506a and 506b provide direct connectivity between pads 502d and 504d (506a), and pads 502e and 504e (506b). The couplings 506a and 506b can pass signals and essentially binds the pad sets (or doubles-up) and is an optional feature of the present invention. Mesh interconnect 512 electrically couples the various signal lines of 508 and 510. Pad set 502 and pad set 504 are thus coupled by the mesh interconnect 512.

In a further embodiment, one or more pads of the first set are configured to allow at least one wire to pass out from each pad of the second set of pads. The pads of the inner sets of pads can be undersized to allow passage of wires. These inner sets pads, such as set 404 and 504 can also be undersized to allow passage of a power supply wire. In certain embodiments, these pads can be undersized to allow passage a ground wire.

Additionally, these pads can be undersized to allow passage of more than one signal wire. By undersizing the pads, a channel is created between the pads for the implementation of signal pathways. In an embodiment, FIGS. 4 and 5 illustrate this feature in principle with the gaps evident between sets of pads 404 and 504 for mesh interconnect 412 and 512, respectively. In another embodiment of the present invention, the outer rows of pads can be undersized if the configured called for the passage of wires.

In one embodiment of the present invention, the multi-concentric pad configuration, further includes one or more additional sets of pads on the integrated circuit die. As with FIG. 5, a mesh interconnect can be used to electrically couple the one or more additional sets of pads.

In a further embodiment, one or more pads of the second set are configured to allow at least one wire to pass through from each pad of the one or more additional sets of pads.

In yet another embodiment, the integrated circuit die is configured with a flip-chip redistribution layer (FCRD layer). The MCP of the present invention is capable of being implemented within a FCRD layer, but this isn't required, and the MCP of the present invention can be implemented without a FCRD, as the MCP provides some of the same advantages of flip-chip implementations without its added expense.

In an alternative embodiment of the present invention, a multi-concentric ring pad configuration on an integrated circuit die includes a first ring of pads on an integrated circuit die, a mesh interconnect that is electrically coupled to the first ring of pads, and a second ring of pads on the integrated circuit die electrically coupled to the mesh interconnect.

FIGS. 6A-9 illustrate some IC embodiments of the present invention. As described in detail below, the various embodiments of MCP can be implemented in combination with one another. These embodiments can utilize different aspects of the IC design to optimize die pad density.

Figure 6A:
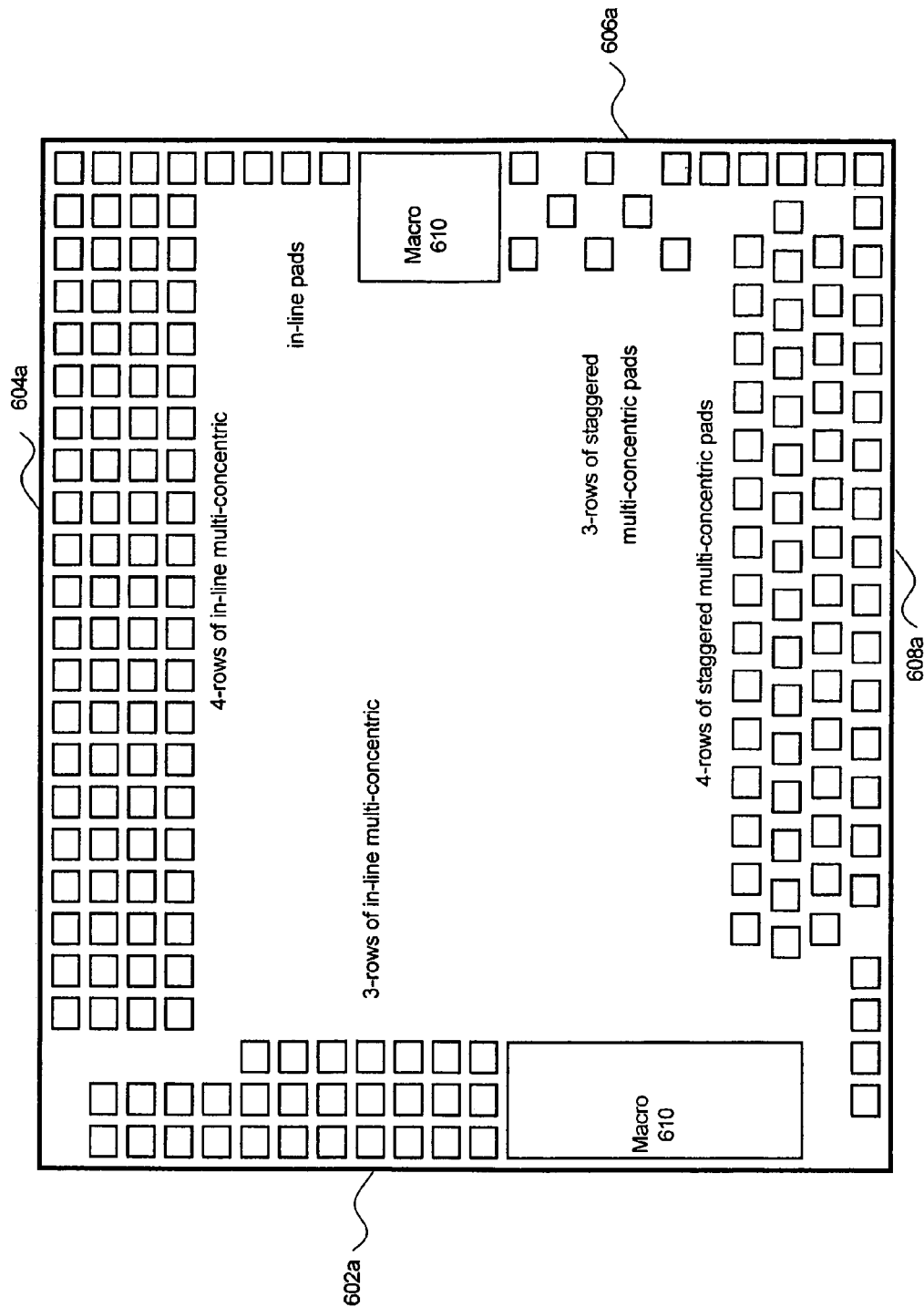
FIG. 6A shows a MCP diagram with a combination of in-line and staggered pad sets according to an embodiment of the present invention.
Figure 6B:
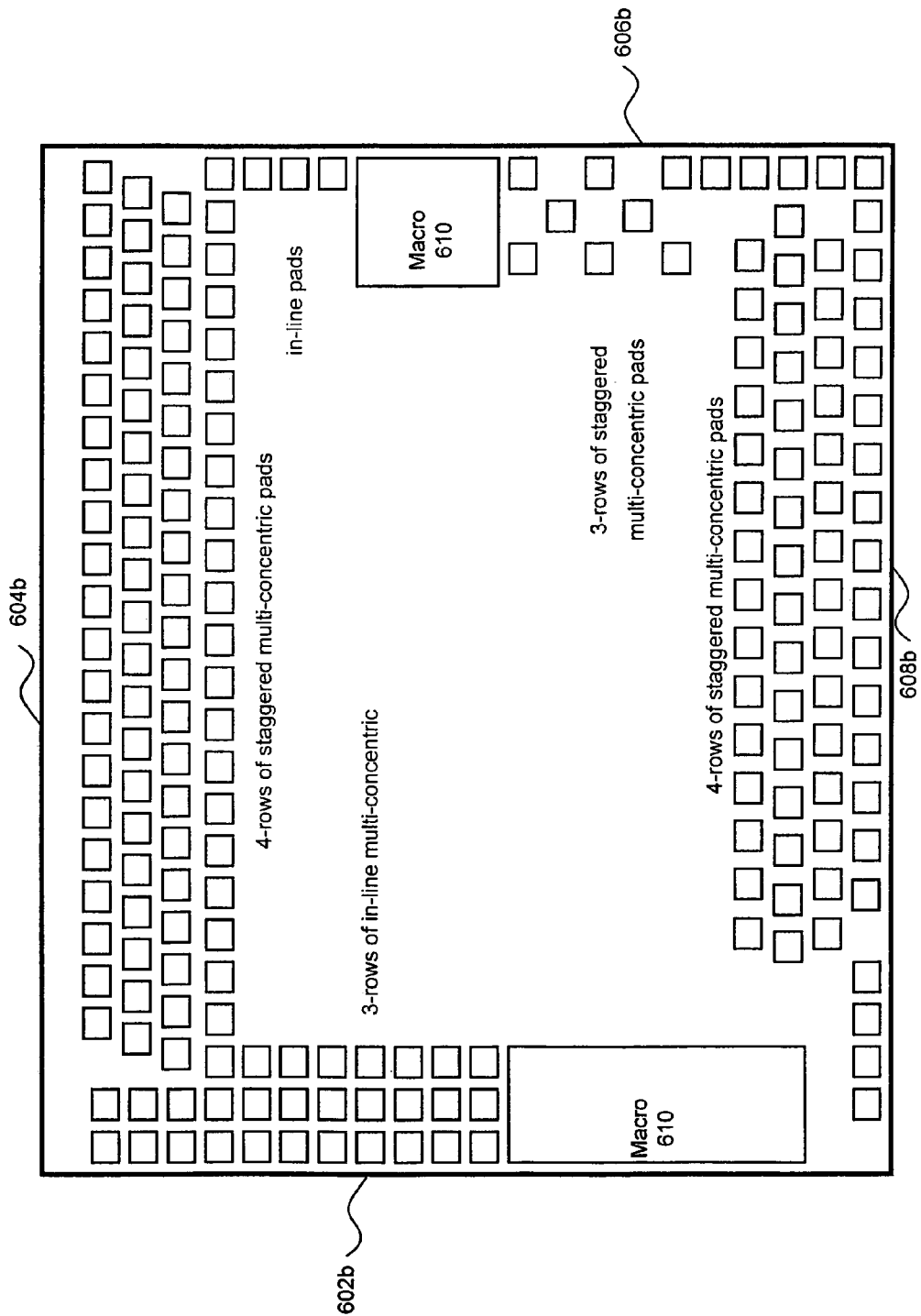
FIG. 6B shows a MCP diagram with a combination of in-line and staggered pad sets according to another embodiment of the present invention.

FIG. 6A shows a MCP diagram with a combination of in-line and staggered pad sets according to an embodiment of the present invention. In FIG. 6A, the pad sets are configured in rows. In an alternative embodiment, the pad sets can be configured as rings. A ring can be a set of pads that includes an entire layer of pads for the IC chip. The rings can be an outermost layer on one side of the IC chip and an inner layer on another side of the IC chip. As shown, multiple sets of pad rows have been configured along the perimeter of the IC chip. These sets include both in-line and staggered. For instance, IO pad sets 602a and 604a are inline pad sets. Sets 606a and 608a are staggered pad sets. The set can be accompanied by macro blocks 610, as well as other modules. The IC design includes one or more macro blocks. An alternative embodiment is illustrated in FIG. 6B, where the top rows of pads are layered in alternative configurations.

Figure 7:
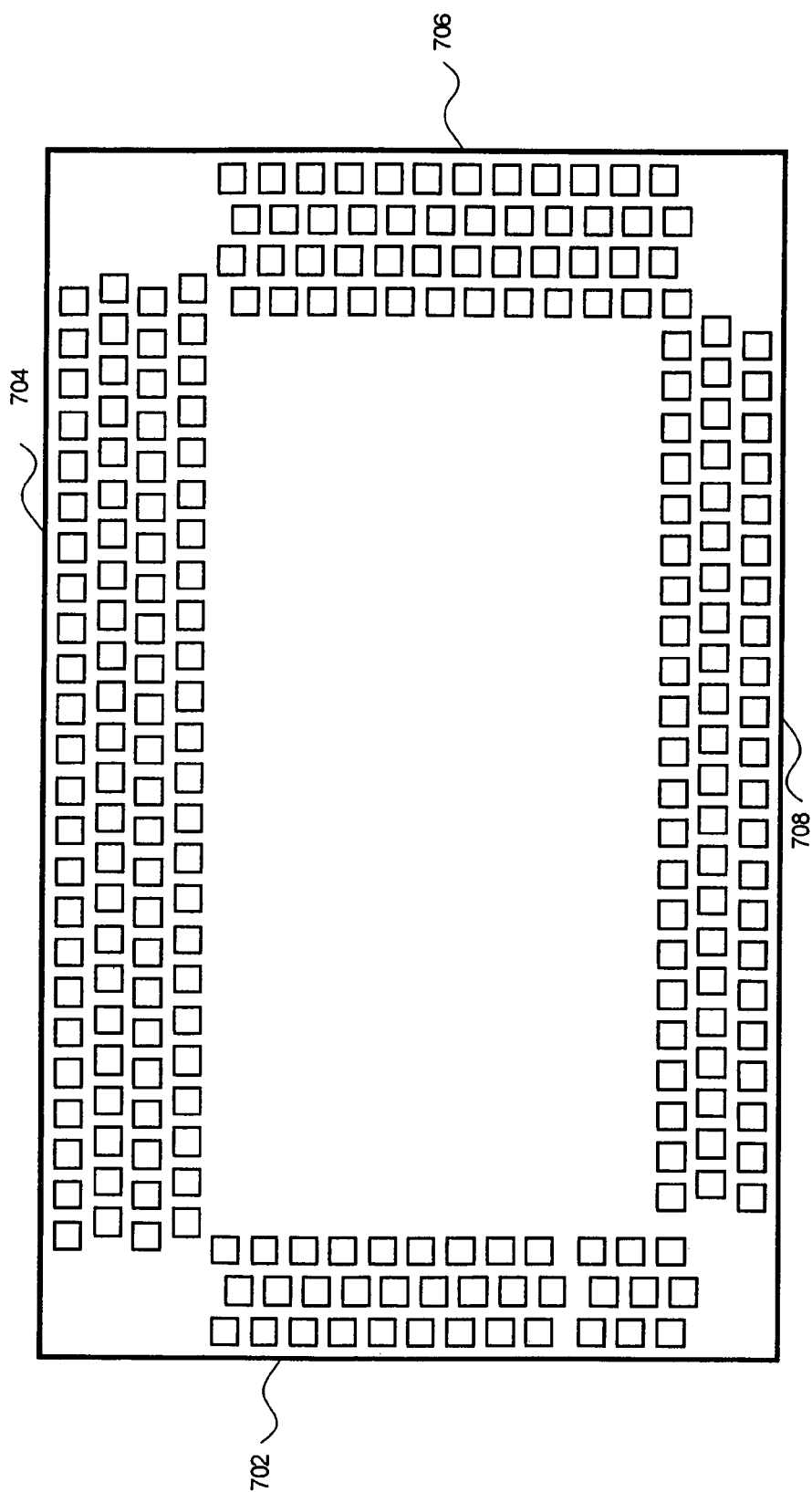
FIG. 7 shows a MCP diagram with multiple sets of staggered pad sets according to an embodiment of the present invention.

FIG. 7 shows a MCP diagram with multiple sets of staggered pad sets according to an embodiment of the present invention. In this embodiment, the rows of pads are configured three and four deep. Pad sets 702, 704, 706 and 708 can be configured as operationally independent sets or linked into rings. In one embodiment, only sets 702 and 704 are linked to form a larger set. In another embodiment, the sets 702, 704, 706, and 708 are linked into rings where the outermost sets of sets 704 and 706 are not linked.

Figure 8:
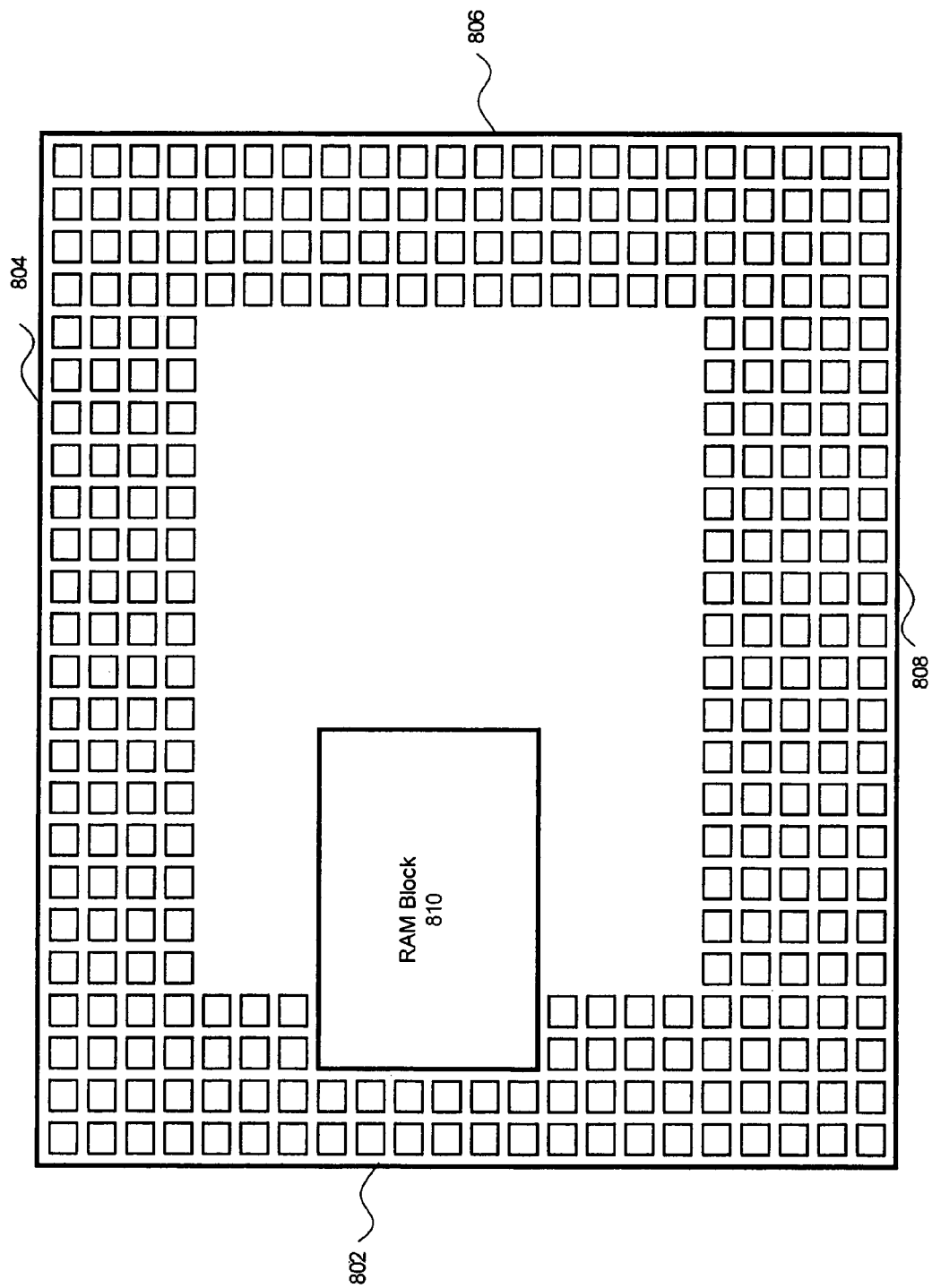
FIG. 8 shows a MCP diagram with multiple sets of in-line pad sets according to an embodiment of the present invention.

FIG. 8 shows a MCP diagram with multiple sets of in-line pad sets according to an embodiment of the present invention.

In FIG. 8, a RAM block 810 is set on the IC with a perimeter filled with two (set 802), four (sets 804 and 806), and five row sets of pads (set 808), configured for MCP operation. In an alternative embodiment, the various rows can be further coupled by the mesh interconnect to form rings around the perimeter of the IC.

Figure 9:
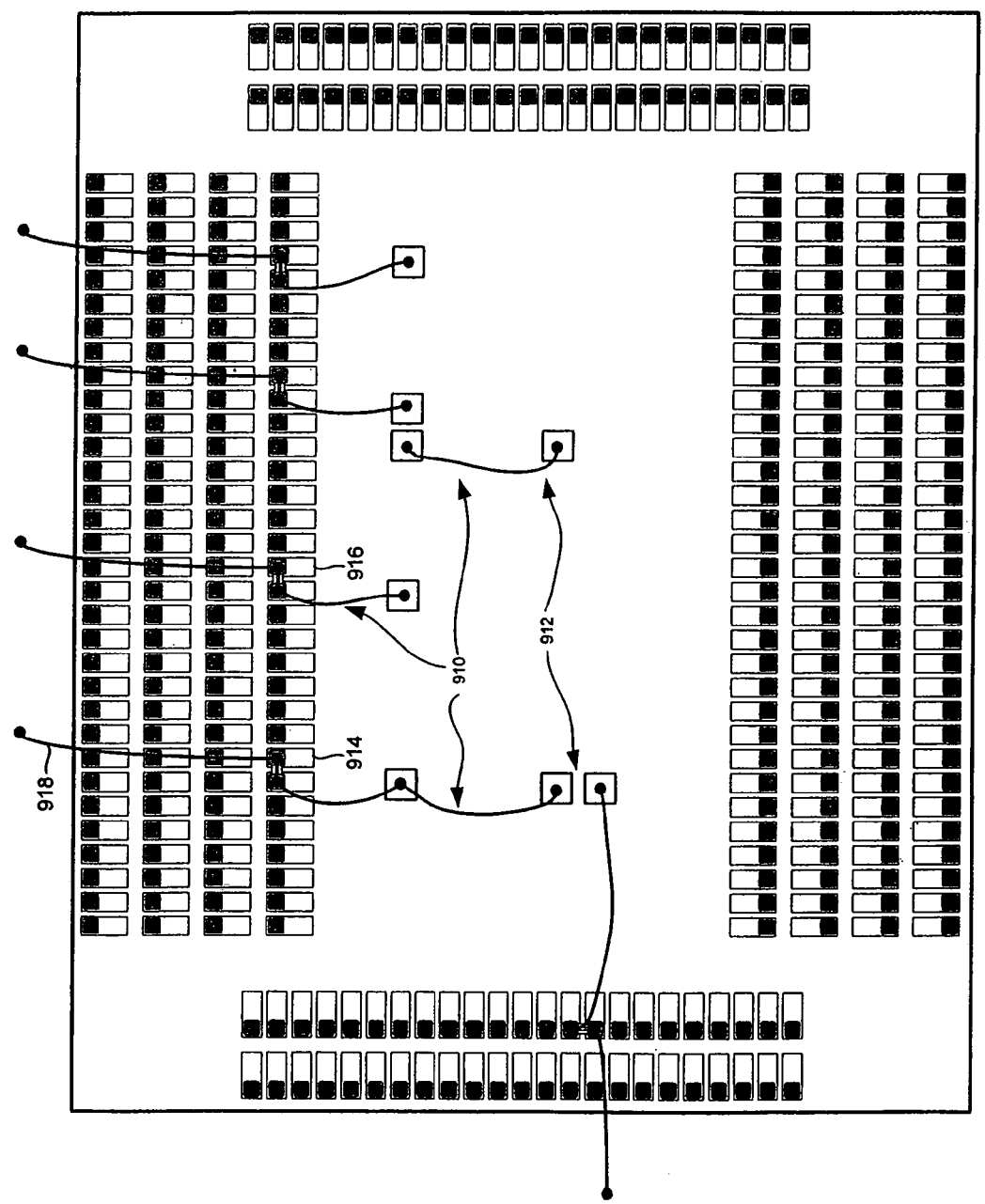
FIG. 9 shows a MCP diagram with in-line pad sets and wire bonded power supplies to the inner set of pads according to an embodiment of the present invention.

FIG. 9 shows a MCP diagram with in-line pad sets and wire bonded power supplies to the inner set of pads according to an embodiment of the present invention. In FIG. 9, bond wires 918 can be used to couple power or ground to pads 914 or 916 as shown. Pads 912 can be placed inside the die and can be electrically coupled via bond wires 910. In this embodiment, the wire bonds jump from the perimeter power and ground pads 914, 916 to pads 912 placed further inside the IC die. This brings power and ground towards the center of the device with less IR drop (Voltage=IR), where current is I, and resistance is R. This allows for higher design margins for the voltage supply.

CONCLUSION

While specific embodiments of the present invention have been described above, it should be understood that they have been presented by way of example only, and not limitation. It will be understood by those skilled in the art that various changes in form and details may be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed:

1. An integrated circuit (IC) die comprising:
   a first set of input/output (I/O) circuits; and
   a second set of I/O circuits;
   a first set of bond pads coupled to corresponding I/O circuits of said first set of I/O circuits; and
   a second set of bond pads coupled to corresponding I/O circuits of said second set of I/O circuits;
   wherein said first set of I/O circuits is placed proximate a first edge portion of said IC die and said second set of I/O circuits is placed farther away from said first edge portion than said first set of I/O circuits.

2. The IC die of claim 1, wherein said first set of bond pads and said second set of bond pads are in an inline arrangement.

3. The IC die of claim 1, wherein said first set of bond pads are in a staggered arrangement and said second set of bond pads are in a staggered arrangement.

4. The IC die of claim 1, wherein said first set of bond pads are in a staggered arrangement and said second set of bond pads are in an inline arrangement.

5. The IC die of claim 1, wherein said first set of bond pads are in an inline arrangement and said second set of bond pads are in a staggered arrangement.

6. The IC die of claim 1, wherein, in a direction parallel to said first edge portion, said first set of I/O circuits and said second set of I/O circuits are not aligned.

7. The IC die of claim 1, wherein said first and second sets of I/O circuits are coupled via a mesh interconnect.

8. The IC die of claim 1, wherein said mesh interconnect provides electrostatic discharge protection.

9. The IC die of claim 7, wherein electrical signals can be transmitted to and from said first and second sets of I/O circuits via said mesh interconnect.

10. The IC die of claim 1, wherein said first and second I/O circuits are coupled to an IC package via at least one bond wire.

11. The IC die of claim 1, wherein adjacent I/O circuits and their corresponding bond pads are configured to allow at least one wire to pass between said adjacent I/O circuits and their corresponding bond pads.

12. The IC die of claim 11, wherein said adjacent I/O circuits and their corresponding bond pads are undersized to allow passage of said at least one wire.

13. The IC die of claim 1, wherein said first and second sets of bond pads interface an external circuit to said IC die and said first and second set of I/O circuits interface to core circuitry disposed on said IC die.

14. The IC die of claim 1, wherein said IC die is configured with a flip-chip redistribution layer.

15. The IC die of claim 1, wherein said first set of I/O circuits and said second set of I/O circuits receive and transmit distinct signals.

16. The IC die of claim 1, wherein each bond pad in said first and second set of bond pads is coupled to a bond wire connection in a direction away from said first edge portion to enable connections with circuitry exterior to said IC die.

* * * * *

UNITED STATES PATENT AND TRADEMARK OFFICE
CERTIFICATE OF CORRECTION

PATENT NO. : 7,528,484 B2
APPLICATION NO. : 11/025118
DATED : May 5, 2009
INVENTOR(S) : Vafa James Rakshani It is certified that error appears in the above-identified patent and that said Letters Patent is hereby corrected as shown below:

Title page
At the end of the Item (*) Notice Section, insert --This patent is subject to a terminal disclaimer.--.

Signed and Sealed this

Twentieth Day of October, 2009

David J. Kappos
*Director of the United States Patent and Trademark Office*